(12) United States Patent
Kang

(10) Patent No.: US 8,178,393 B2
(45) Date of Patent: May 15, 2012

(54) SEMICONDUCTOR PACKAGE AND MANUFACTURING METHOD THEREOF

(75) Inventor: In-Ku Kang, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 344 days.

(21) Appl. No.: 12/480,980

(22) Filed: Jun. 9, 2009

(65) Prior Publication Data

US 2009/0311830 A1    Dec. 17, 2009

(30) Foreign Application Priority Data

Jun. 16, 2008   (KR) .............................. 10-2008-56441

(51) Int. Cl.
    *H01L 21/00* (2006.01)
(52) U.S. Cl. ........................................ 438/113; 438/460

(58) Field of Classification Search .................. 438/106, 438/113, 118, 458, 460, 462
See application file for complete search history.

(56) References Cited

U.S. PATENT DOCUMENTS

| 5,171,712 | A  | * | 12/1992 | Wang et al. ..................... 438/17 |
| 6,348,363 | B1 |   | 2/2002  | Chung et al. |
| 7,306,955 | B2 | * | 12/2007 | Yang ................................ 438/9 |
| 2003/0011079 | A1 |   | 1/2003 | Takano et al. |
| 2006/0163704 | A1 |   | 7/2006 | Ding |

FOREIGN PATENT DOCUMENTS

| JP | 2001024024 | 1/2001 |
| JP | 2003-031604 | 1/2003 |
| KR | 20010008946 | 2/2001 |

* cited by examiner

*Primary Examiner* — Brook Kebede
(74) *Attorney, Agent, or Firm* — Stanzione & Kim, LLP

(57) ABSTRACT

A semiconductor chip, semiconductor package including the same, and a method of manufacturing the semiconductor chip and semiconductor package to block up electrical contacts between bonding wires and the semiconductor chip by providing insulation over the edge of the semiconductor chip.

14 Claims, 4 Drawing Sheets

SEMICONDUCTOR PACKAGE AND MANUFACTURING METHOD THEREOF

CROSS-REFERENCE TO RELATED APPLICATIONS

This U.S. non-provisional patent application claims priority under 35 U.S.C. §119 of Korean Patent Application No. 10-2008-56441 filed on Jun. 16, 2008, the entire contents of which are incorporated herein by reference.

BACKGROUND

Field of the Invention

The exemplary embodiments disclosed herein relate to a semiconductor package and manufacturing method thereof.

By lightening, filming, shortening, and miniaturizing electronic machines, their core components packages are heading for higher density and more inclusion therein. In computing systems, semiconductor chips are usually enlarged in size, as like large-capacity random access memories and flash memories, in need of extension of data preservability, whereas packages (or assemblies) are focused on miniaturization in correspondence with such requirements. As even semiconductor chips of the same capacity are relatively scaled down while trending from edge pad types toward center pad types, those are being mostly associated with the center pad types in order to yield more chips from a semiconductor wafer that is confined in 6, 8, or 12 inches.

Additionally, an important one of technologies to efficiently implement product designs for semiconductor chips is a package framing, exemplarily a ball grid array (BGA) style that has been developed in recent years. The BGA packages are more advantageous than traditional plastic packages in shrinking down practical areas on mother boards and in electrical characteristics.

The BGA package employs a printed circuit board instead of a lead frame, which is different from a plastic package. Such a printed circuit board is helpful to entirely providing the backside of a face, which contacts with a semiconductor chip, for a region of solder balls that act as connection terminals to the outside of the package. That construction would be useful to increasing packing density on a mother board.

However, in a case of mounting a center-pad semiconductor chip on a lead frame or a BGA-specific printed circuit board and using bonding wires for electrical connection thereto, there could be electrical shorts due to the bonding wires making contact with corners of the active surface of the semiconductor chip.

SUMMARY

The exemplary embodiments disclosed herein provide a semiconductor package and manufacturing method thereof capable of preventing electrical shorts between bonding wires and a semiconductor chip.

Additional aspects and utilities of the present general inventive concept will be set forth in part in the description which follows and, in part, will be obvious from the description, or may be learned by practice of the general inventive concept.

An exemplary embodiment provides a method of isolating a semiconductor chip. This method includes preparing a semiconductor wafer including a chip region having a semiconductor chip and a scribing lane adjacent to the chip region. An insulation layer is formed to cover the chip region. The scribing lane is etched to divide the semiconductor chips by using a photoresist pattern as an etching mask.

Another exemplary embodiment provides a method of manufacturing a semiconductor package. The method of manufacturing a semiconductor package includes preparing a semiconductor wafer including chip regions having respective semiconductor chips and a scribing lane disposed between the chip regions. An insulation layer is formed to cover the semiconductor chips and to cover a portion of the scribing lane. A first tape is formed to cover a top side of the semiconductor wafer. The scribing lane is etched to expose the insulation layer by using a photoresist pattern as an etching mask and to divide the semiconductor chips. A second tape is attached to a bottom side of the semiconductor wafer.

Another exemplary embodiment provides a semiconductor chip. The semiconductor chip includes an integrated circuit substrate in which an integrated circuit is formed. An electrode pad is electrically connected to the integrated circuit on a top surface of the integrated circuit substrate. An insulation layer entirely covers the top surface of the integrated circuit substrate, except the electrode pad, to protect the integrated circuit, and extends out beyond the edge of the integrated circuit substrate.

Another exemplary embodiment provides a semiconductor package. The semiconductor package includes a semiconductor chip attached to a substrate. A bonding wire electrically connects an electrode pad of the semiconductor chip to a conductive pad of the substrate. An insulation layer is placed between the bonding wire and the edge of the semiconductor chip and extends out beyond the edge of the semiconductor chip while entirely covering a top surface of the semiconductor chip except the electrode pad of the semiconductor chip.

Another exemplary embodiment provides a method of isolating a semiconductor chip, the method including: forming an insulation layer over a top surface of a semiconductor wafer including chip regions, the insulation layer including scribe lanes formed therein; forming a resist pattern with openings across a bottom surface of the semiconductor wafer, the resist patterns aligning with and being larger than the scribe lanes; and etching the semiconductor wafer to divide the semiconductor chip by using a photoresist pattern as an etching mask such that ends of the insulation layers extend beyond the divided semiconductor chips.

Embodiments proposed throughout this description are relevant to an isolation method of semiconductor chips, a semiconductor chip formed by the isolation method, a semiconductor package manufacturing method, and a semiconductor package formed by the package manufacturing method. The semiconductor package is made by first dividing semiconductor chips from a wafer, attaching the semiconductor chip to a base substrate such a printed circuit board, and electrically connecting the semiconductor chip to the printed circuit board by wire bonding.

According to these embodiments of the present general inventive concept, even a simplified process makes it possible to prevent electrical shorts between the semiconductor chip and bonding wires.

A further understanding of the nature and advantages of the present general inventive concept herein may be realized by reference to the remaining portions of the specification and the attached drawings.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

Non-limiting and non-exhaustive embodiments of the present general inventive concept will be described with reference to the following figures, wherein like reference numerals refer to like parts throughout the various figures unless otherwise specified. In the figures.

DETAILED DESCRIPTION OF THE EMBODIMENTS

Figure 1:
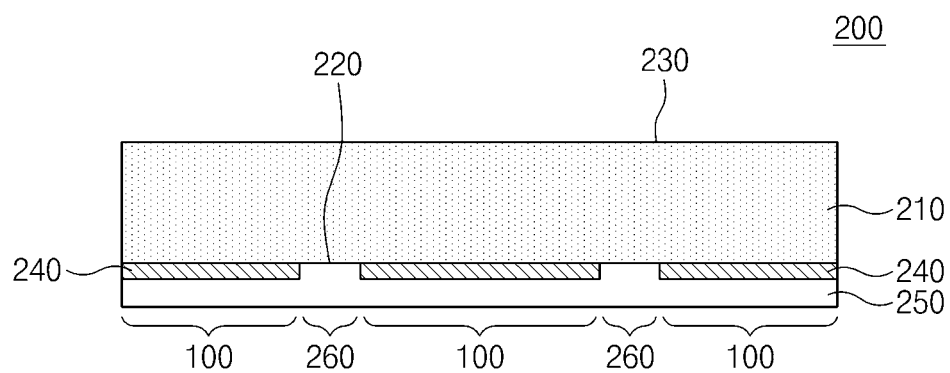
FIGS. 1 through 9 are sections of processing operations to isolate individual semiconductor chips from a wafer in accordance with an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

In a semiconductor fabrication process, isolating semiconductor chips from each other begins after a tape mounting operation for attaching a supporting tape to the backside of an active surface of a semiconductor wafer. To separate semiconductor chips from the wafer, it is permissible to utilize a wafer sawing device installed at a diamond wheel blade, as well as laser beam or plasma. In general, grits of the diamond wheel blade is sized in 2~2 μm or 0.3~3 μm. And the blade cuts away the wafer by 20 mm per second along a scribing lane in rotation rate of 35,000~40,000 rpm.

According to an embodiment of the present general inventive concept, chip isolation (chip separation or chip division) can be carried out by means of a plasma or chemical etching method using an etching gas or an etchant, instead of a physical method, which is often performed by using a diamond blade. For example, plasma or chemical etching is able to isolate the semiconductor chips from the wafer by means of $SF_6$ plasma.

Now will be described exemplary embodiments of the present general inventive concept with reference to the accompanying figures. However, the present general inventive concept may be performed in other forms, and is not restrictive hereto. Rather, these embodiments are provided so that this disclosure will be thorough and complete, and will fully convey the scope of the present general inventive concept to those skilled in the art.

FIGS. 1 through 9 are sections of processing operations to isolate pluralities of semiconductor chips from a wafer in accordance with embodiments of the present general inventive concept. Referring to FIG. 1, a semiconductor wafer 200 includes a plurality of chip regions 100 on a semiconductor substrate 210 such as an integrated circuit substrate which can be made of silicon. The chip regions 100 are separated by a scribing lane 260. Each of the chip regions 100 includes a semiconductor chip having an integrated circuit (not shown). An insulation layer 240, for example, a polyimide layer, is formed to protect the integrated circuit from external forces, such as air, dust, etc. A backlap tape 250 (first tape) is attached to the top side 220 of the semiconductor wafer 200, i.e., the active surface of the semiconductor substrate 210. The backlap tape 250 protects the top side 220 of the semiconductor wafer 200 when processing a bottom side 230 of the semiconductor chip 200, i.e., the backside of the semiconductor substrate. The polyimide layer 240 may be formed to expose at least a portion of the scribing lane 260, which makes it easier to isolate the semiconductor chips.

The insulation layer 240 may be made of an epoxy-series plastic resin. For instance, after forming polyimide to entirely cover the top side of the semiconductor wafer, a photolithography process is conducted to partly remove the polyimide therefrom. Thereby, the polyimide layer 240 covers the top side of the chip regions, i.e., the top surface of the chip, while exposing a portion of the electrode pads and the scribing lane (e.g., covering a portion of the scribing lane).

Figure 2:
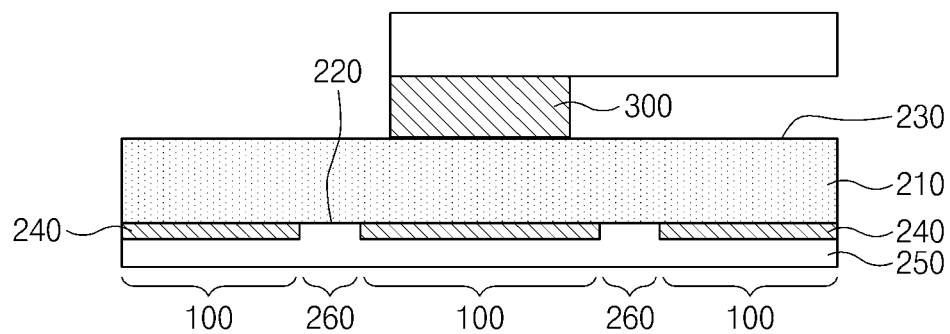

Next, referring to FIG. 2, the bottom side 230 of the wafer 200 is processed to have a predetermined thickness. The bottom side 230 of the wafer 200 may be processed by means of chemical and mechanical polishing (CMP) that uses a diamond wheel 300 while spraying a slurry onto the wafer 200, dry polishing with a silica adhesive pad, wet etching with chemicals, or plasma processing with plasma and chemicals. In addition, a plasma stress relief process is further conducted to relieve plasma stress on the wafer.

Figure 3:
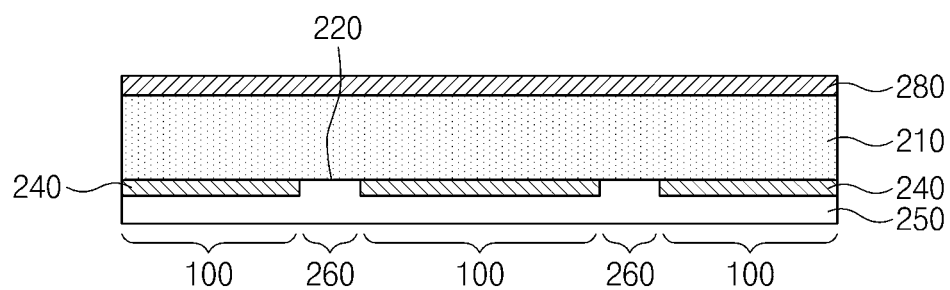

Then, referring to FIG. 3, a photoresist resin 280 is formed on the bottom side 230 of the semiconductor wafer 200, which has been processed to a predetermined thickness, by means of a spin coating technique. During this process, it is permissible to add a hardening process thereto before or after forming the photoresist resin 280.

Figure 4:
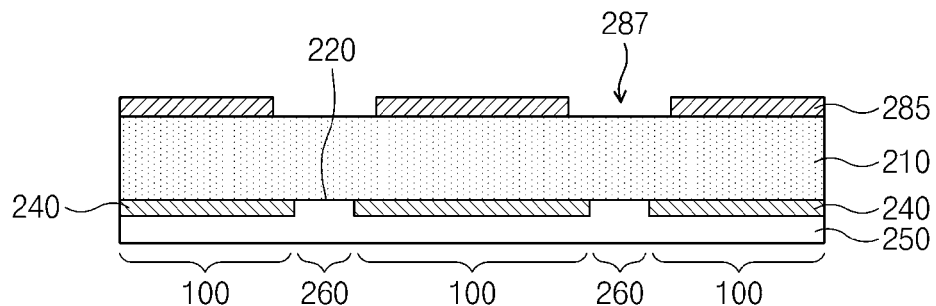

The photoresist resin 280 formed on the bottom side 230 of the semiconductor wafer 200 is patterned to result in a photoresist pattern 285 as shown in FIG. 4. The photoresist pattern 285 includes openings 287 corresponding to the scribing lane 260 so as to separate the semiconductor chips (chip regions) in the next processing operation. The openings 287 of the photoresist pattern 285 can be variably formed in width.

Figure 5:
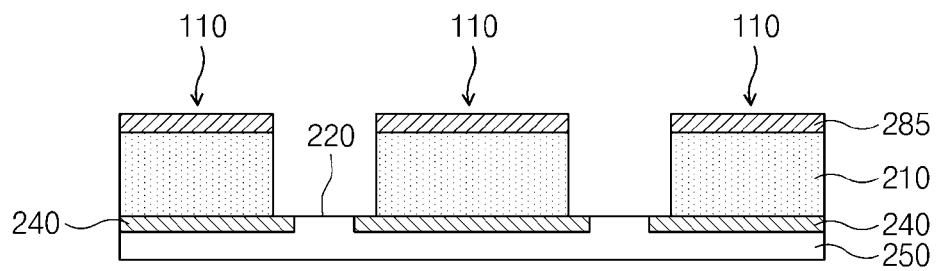

Next, referring to FIG. 5, parts of the semiconductor wafer exposed by the openings 287, i.e., the scribing lane, are removed to isolate the individual semiconductor chips 110. For instance, $SF_6$ plasma may be used to selectively etch away portions of the semiconductor wafer 200. A width of the opening 287 of the photoresist pattern 285 may be designed to make the polyimide layer 240 extend outward over the edge of the individual semiconductor chip 110.

The polyimide layer 240 extending out of the edge of the semiconductor chip 110 functions to prevent the edge of the semiconductor chip 110 from contacting the bonding wires during a wire bonding process subsequent thereto. According to the chip isolation method of the present embodiment, it simplifies processing operations because the polyimide layer is partly used to protect the semiconductor chips without an additional process thereof. Moreover, according to the chip isolation method of the present embodiment, it is easy to control the photolithography process to adjust a length of the part of the polyimide layer 240 extending out of the edge of the semiconductor chip 110.

Figure 6:
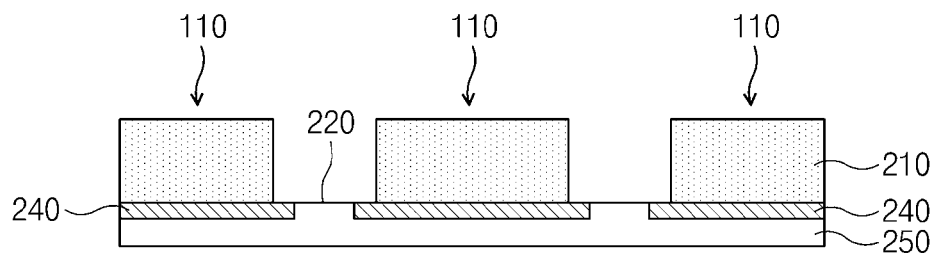

After physically isolating the individual semiconductor chips 110 from the semiconductor substrate 210, referring to FIG. 6, the photoresist pattern 285 is removed from the bottom side of the wafer. An ashing technique may be used to remove the photoresist pattern 285 by employing oxygen ($O_2$) plasma.

Figure 7:
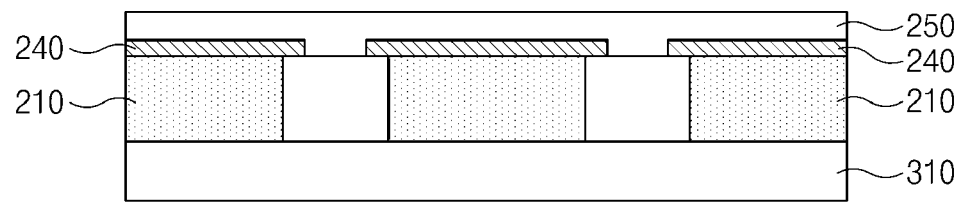

Next, as shown in FIG. 7, a die attaching film 310 (second tape) is formed on the bottom side of the semiconductor wafer 200 (i.e., back side of the semiconductor chip 110) for the subsequent chip bonding process.

Figure 8:
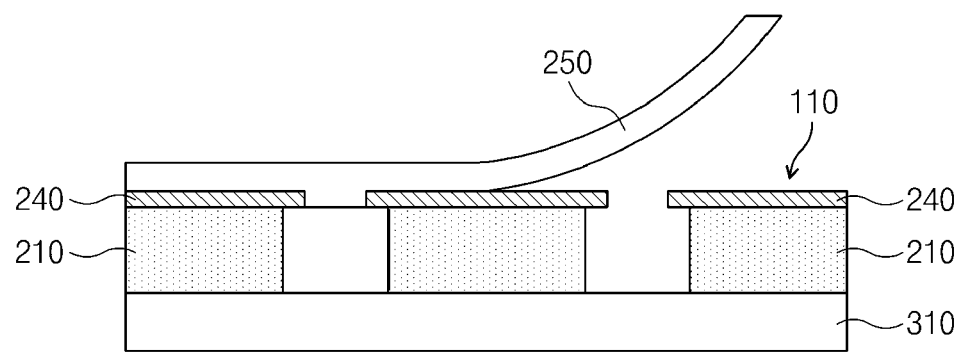
Figure 9:
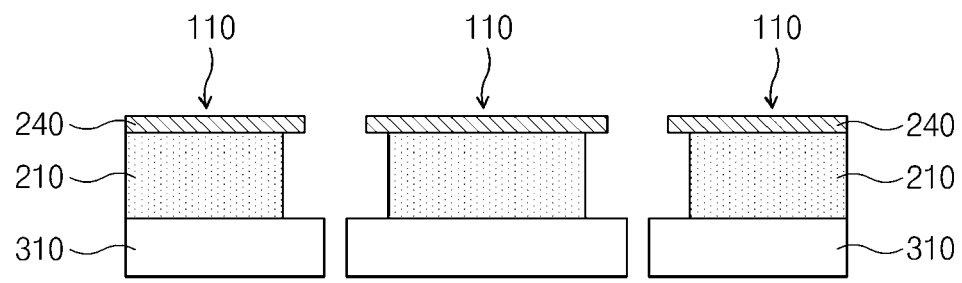

Then, referring to FIGS. 8 and 9, by removing the backlap tape 250 and separating the die attaching film 310 in correspondence with the individual semiconductor memory chips, it terminates the process to separate the wafer 200 into the individual semiconductor chips 110.

Figure 10:
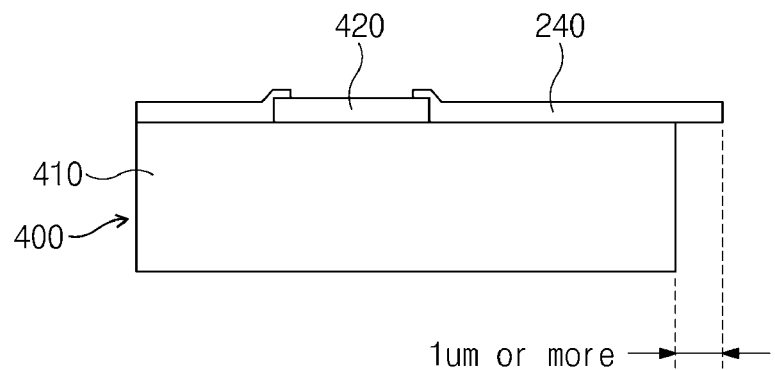
FIGS. 10 and 11 are sections illustrating a feature of wired bonding patterns on an individually isolated semiconductor chip in accordance with an embodiment of the present general inventive concept.
Figure 11:
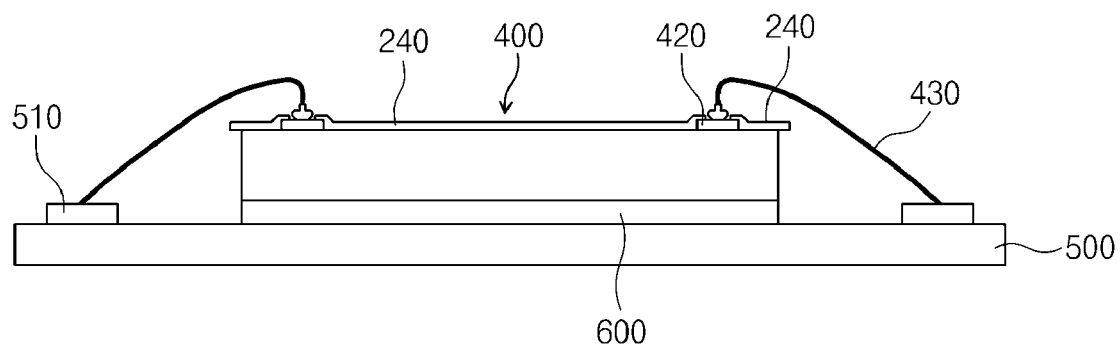

FIGS. 10 and 11 are sections illustrating a feature of wired bonding patterns on the individually isolated semiconductor chip in accordance with an embodiment of the present general inventive concept, illustrating a packaging process with an individual semiconductor chip 400 that is fabricated by the procedure as like that shown in FIGS. 1 through 9. Referring to FIG. 10, the semiconductor chip 400 according to an embodiment of the present general inventive concept may include an integrated circuit substrate 410 in which an integrated circuit is placed, an electrode pad electrically connected to the integrated circuit, and an insulation layer 240 protecting the integrated circuit. The insulation layer 240 can be formed to extend out beyond the edge of the semiconductor chip 400, and entirely covering the top of the semiconductor chip except for the electrode pads 420. In an embodiment, the insulation layer 240 may cover even the edge of the electrode pads 420. The insulation layer 240 may be made of a material, e.g., polyimide, suitable to protect the semiconductor chip from external environments or preventing the integrated circuit from damages. The insulation layer 240 may be formed to cover the edge of the semiconductor chip 400 by which bonding wires are passing. In an embodiment, the insulation layer 240 may extend out of the edge of the semiconductor chip 400, i.e., outward from the side of the semiconductor chip 400 by about 1 µm or more.

Although flying debris or sticking particles arising from bonding connections or other conductive layers during the isolation process of the semiconductor wafer may be present around the edge at which bonding wires 430 are connected to the electrode pads 420, the polyimide formed around the edge is helpful in restraining generation of short circuits between the semiconductor chip 400 and the bonding wires 430.

After isolating the semiconductor chips from the wafer, the semiconductor chip 400 is attached on a substrate 500, such as a printed circuit board, by means of an adhesive 600. The adhesive 600 may be used with the die attaching film 310 aforementioned. Then, the bonding wires 430 are formed to electrically connect the electrode pads 420 with conductive pads 510 of the substrate 500. As another embodiment, in a structure in which wires are connected to bonding pads of a semiconductor chip, it is permissible to form an insulative tape instead of the polyimide layer, or additionally, to cover the corners of the semiconductor chip as like the aforementioned. This is also useful to provide electrical isolation for preventing the bonding wires from contacting to the semiconductor chip.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of isolating a semiconductor chip, the method comprising:
   preparing a semiconductor wafer including a chip region having the semiconductor chip and a scribing lane adjacent the chip region;
   forming an insulation layer to cover a top surface of the chip region; and
   etching the scribing lane by using a photoresist pattern as an etching mask such that the insulation layer covers the top surface of and extends out beyond an edge of the semiconductor chip.

2. The method of claim 1, wherein the insulation layer comprises a polyimide layer.

3. The method of claim 1, wherein etching the scribing lane comprises etching the scribing lane such that the insulation layer extends out beyond the edge of the semiconductor chip by at least 1 µm.

4. The method of claim 1, wherein forming the insulation layer comprises forming the insulation layer to cover the chip region and a portion of the scribing lane.

5. The method of claim 1, further comprising:
   a backlap process to polish a surface of the semiconductor wafer before forming the photoresist pattern, wherein the backlap process includes chemical and mechanical polishing, wet etching, or plasma processing.

6. The method of claim 1, wherein etching the scribing lane comprises etching the scribing lane to expose the insulation layer.

7. The method of claim 1, wherein forming the insulation layer comprises forming the insulation layer not to cover sidewalls of the semiconductor chip.

8. A method of manufacturing a semiconductor package, the method comprising:
   preparing a semiconductor wafer including chip regions having a semiconductor chip respectively and a scribing lane disposed between the chip regions;
   forming an insulation layer to cover the chip regions and a portion of the scribing lane;
   forming a first tape on a top side of the semiconductor wafer;
   etching the scribing lane to expose the insulation layer by using a photoresist pattern as an etching mask such that the insulation layer covers a top surface of each semiconductor chip and extends beyond edges of each semiconductor chip over the portion of the scribing lane, and dividing the semiconductor chips; and
   attaching a second tape to a bottom surface of the semiconductor wafer.

9. The method of claim 8, further comprising:
   removing the first tape;
   attaching the semiconductor chip to a substrate; and
   forming a bonding wire to electrically connect a conductive pad of the substrate with an electrode pad of the semiconductor chip.

10. The method of claim 8, wherein attaching a second tape comprises: forming a die attaching film on the bottom surface of the semiconductor wafer.

11. The method of claim 10 further comprising:
    removing the first tape;
    separating the die attaching film in correspondence with the divided semiconductor chips and sticking the divided semiconductor chips to a substrate by means of the die attaching film; and
    forming a bonding wire to electrically connect a conductive pad of the substrate with an electrode pad of the semiconductor chip.

12. The method of claim 8, wherein forming the insulation layer comprises forming the insulation layer not to cover sidewalls of the semiconductor chip.

13. A method of isolating a semiconductor chip, the method comprising:
    forming an insulation layer over a top surface of a semiconductor wafer including chip regions, the insulation layer including scribe lanes formed therein;
    forming a photoresist pattern with openings across a bottom surface of the semiconductor wafer, the openings aligning with and being larger than the scribe lanes of the insulation layer; and etching the semiconductor wafer by using the photoresist pattern as an etching mask to divide the chip regions into semiconductor chips such that the insulation layer covers top surfaces of the divided semiconductor chips and extends beyond edges of the divided semiconductor chips.

14. The method of claim 13, wherein forming the insulation layer comprises forming the insulation layer not to cover sidewalls of the semiconductor chip.

* * * * *